United States Patent [19]
Bukowski et al.

[11] Patent Number: 4,841,254
[45] Date of Patent: Jun. 20, 1989

[54] CMOS PRECISION GAIN AMPLIFIER

[75] Inventors: Eugene R. Bukowski, Cary; Charles R. Hoffman, Raleigh, both of N.C.

[73] Assignee: International Business Machines Corp., Armonk, N.Y.

[21] Appl. No.: 55,651

[22] Filed: May 29, 1987

[51] Int. Cl.$^4$ .............................................. H03F 3/45
[52] U.S. Cl. ...................................... 330/253; 330/254
[58] Field of Search ............... 330/253, 254, 260, 261, 330/291, 104

[56] References Cited

FOREIGN PATENT DOCUMENTS 38009  3/1982  Japan .................................. 330/253

OTHER PUBLICATIONS

Hoffman, "Self-Adjusting Bias Current Generator for IC Amplifier", IBM Technical Disclosure Bulletin, vol. 23, No. 7B, Dec. 1980, pp. 3330-3331.

*Primary Examiner*—Gene Wan
*Attorney, Agent, or Firm*—Joscelyn G. Cockburn

[57] ABSTRACT

A precision gain circuit arrangement for amplifying analog type signals is fabricated on an integrated chip with digital devices in a CMOS process. The circuit arrangement includes a high gain operational amplifier with a series connected pair of FET devices setting a reference voltage ($V_{ref}$) at the inverting input of the operational amplifier and a feedback circuit including a parallel connected pair of FET devices and a biasing FET for said pair set the gain of said circuit arrangement.

15 Claims, 3 Drawing Sheets

CMOS PRECISION GAIN AMPLIFIER

BACKGROUND OF THE INVENTION

1. Field of the Invention

The present invention relates to amplifier circuits in general and, more particularly, to amplifier circuits for implementation on an integrated circuit chip with a digital fabricating process.

2. Prior Art

Semiconductor technology has progressed to the point where entire systems (such as logic circuits, memory circuits, microprocessor circuits, analog circuits, etc.) are being integrated on a single silicon chip. Due to the wide range of functions, trade-offs between individual function optimization and overall process capability must be made. Since the logic and memory functions represent the majority of the total system circuitry, the fabricating process is usually designed to optimize these functions. Among the available processes, the CMOS process appears to be the most effective and widely used to fabricate Very Large Scale Integration (VLSI) chips.

One of the cost reduction characteristics of the CMOS technology is that it operates on a single power supply level (usually +5 V). This is made possible because digital circuits are either "ON" or "OFF." In contrast, analog circuits, such as amplifiers, must be operated in their linear region where circuit nodes must be biased at a voltage level somewhere between the power supply level and ground. Providing an intermediate biasing voltage has always been a problem in CMOS technology, since extraneous process steps and/or devices are needed. This, in turn, tends to increase the product cost and negate some of the favorable characteristics that make the CMOS process attractive for fabricating mixed circuit VLSI chips.

Mixed circuit VLSI chips with precision gain amplifiers have been designed in CMOS technology using switched capacitor techniques. An example of this technique is set forth in an article entitled "Switched-Capacitor Circuit Design" by Gregorian, R. et al, Procedures of IEEE. Even though the technique works well for its intended purpose, its main drawback is that it requires clocks and sampling techniques to extract the amplified signal. As a result, the switched capacitor approach cannot handle signals whose frequency approaches the frequency limit of the technology. In addition, the switched capacitor technique is a sampled one and does not provide continuous amplification. Also, switched capacitor circuits consume large amounts of chip area and introduce noise into the signal.

An amplifier structure that provides continuous amplification has been designed in NMOS technology. An example of the amplifier structure is given in U.S. Pat. No. 4,659,811. In that patent a pair of depletion mode devices (biased in their linear regions with their combined current equal to a constant value) in the feedback of an operational amplifier control the gain of the amplifier. The major drawback with this design is that depletion mode FETs are not available in CMOS technology. Also, a multi-rail power supply is needed. As argued above, multi-rail power supplies are not economically attractive and efforts are made to avoid their use in CMOS technology.

SUMMARY OF THE INVENTION

It is, therefore, the main object of the present invention to provide a circuit arrangement that amplifies signals continuously within a desired signal range.

It is a further object of the present invention to fabricate the circuit arrangement with CMOS technology using only digital components.

The circuit arrangement includes an operational amplifier having an inverting input and a non-inverting input with respect to its output. A reference voltage input circuit having a pair of series connected P-channel FET devices is connected between the supply voltage level of a single rail or level power supply system and a ground potential. The voltage level that is generated between the pair of P-channel devices is connected to the inverting input of said op amp. A gain setting input circuit comprising a pair of parallel connected P-channel FET devices is connected in a negative feedback loop of the operational amplifier. The gain of the circuit arrangement is controlled by the (W/L) ratio of the devices in the gain setting input circuit. The circuit arrangement is insensitive to process variation if the (W/L) ratio of the biasing components in the reference voltage input circuit and the gain setting input circuit satisfy the following expression:

$$\frac{(W/L)_{Q_1} + (W/L)_{Q_2}}{(W/L)_{Q_3}} = \frac{(W/L)_{Q_4}}{(W/L)_{Q_5}}$$

where W represents the width of a device, L represents the length of the device, Q1 and Q2 represent parallel connected devices in the gain setting input circuit, Q3 represents the series connected device in the input circuit and Q4 and Q5 represent devices in the reference voltage input circuit.

In an alternate embodiment of the present invention the gain setting input circuit includes two P-channel FET devices connected in series with each other and in series with the pair of parallel connected P-channel FET devices. This configuration biases the pair of parallel connected devices to operate in the linear region of their respective characteristic curves. This, in turn, causes the circuit arrangement to amplify over a wider range of input signals.

The foregoing features and advantages of this invention will be more fully described in the accompanying drawings.

DETAILED DESCRIPTION OF THE PREFERRED EMBODIMENT

Precision gain amplifiers with a continuous output signal (that is, not pulse sampled output) are required for many circuit applications. In bipolar circuits this is usually achieved by combining resistors in the feedback network of an operational amplifier. The gain is established by controlling the ratio of the resistors and the output is an amplified reproduction of the input signal.

In integrated circuit designs on silicon semiconductor chips, resistors require too much area space on the chip and as such biasing by resistors in this technology is not a satisfactory approach. Described below is a CMOS precision gain amplifier in which the biasing and gain setting devices are digital devices. The description will be for an N-well CMOS process. However, by substituting N-channel devices for P-channel devices the description is equally applicable to a P-well CMOS process.

Figure 1:
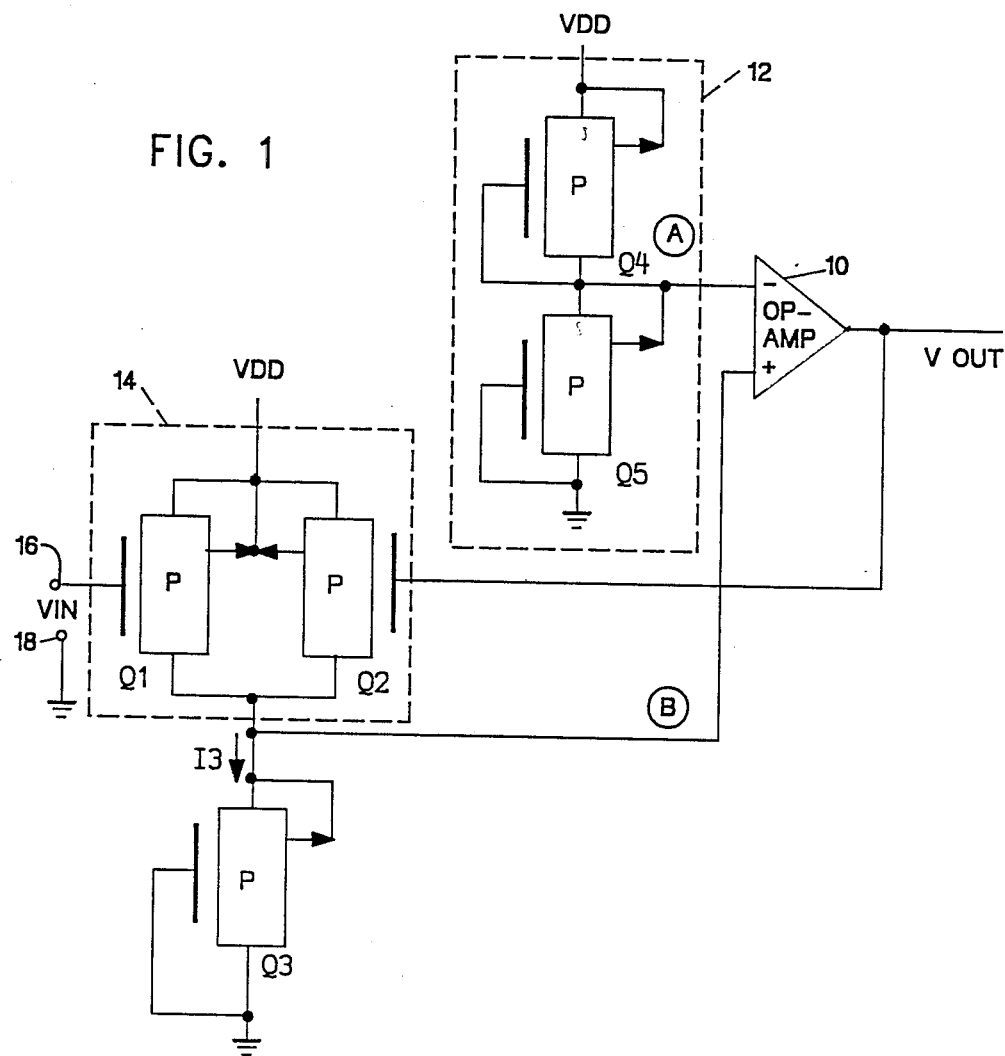
FIG. 1 is a circuit diagram showing the precision gain amplifier circuit according to the teaching of the present invention.

FIG. 1 shows a circuit diagram of a precision gain CMOS amplifier according to the teachings of the present invention. The circuit diagram includes an amplifier 10 which may be any conventional design—operational amplifier. The design and use of operational amplifiers are well known in the prior art. Therefore, a detailed description of amplifier 10 will not be given. Suffice is to say that amplifier 10 has an output terminal labeled $V_{out}$, a negative input terminal and a positive input terminal. The negative input terminal is connected at node A to a voltage divider network 12. Voltage divider network 12 is connected between the single source power supply $V_{dd}$ and ground potential. The voltage divider network generates and establishes a reference voltage on the negative input terminal of the operational amplifier. This reference serves as an AC quiescent reference for analog signals that vary above and below AC ground. Although the reference voltage can be any value between $V_{dd}$ and ground, in the preferred embodiment of this invention, the reference equals $0.5 V_{dd}$.

Still referring to FIG. 1, the voltage divider network 12 includes P-channel FET device Q4 connected in series to P-channel FET device Q5. P-channel FET device Q4 is a four-terminal device in which the source terminal and substrate terminal are connected to $V_{dd}$ and the gate and drain terminals are connected to node A. Similarly, P-channel FET device Q5 is a four-terminal device having its substrate terminal and source terminal connected to node A and its gate terminal and drain terminal connected to ground potential. It should be noted that the substrate terminal of each FET device is identified by an arrowhead.

Still referring to FIG. 1, a feedback loop interconnects the output of the operational amp to its positive input terminal. A gain setting circuit arrangement 14 is connected to node B of the feedback loop. The gain setting circuit arrangement 14 sets the overall gain for the precision gain amplifier circuit. The gain setting circuit arrangement 14 includes P-channel FET device Q1 and P-channel FET device Q2. FET devices Q1 and Q2 are connected in parallel between voltage supply source $V_{dd}$ and node B. The current I3 at node B is set by P-channel FET device Q3. Q3 couples node B to ground potential. P-channel FET device Q1 is a four-terminal device having its gate or control terminal connected to input terminal 16 and its substrate and source electrodes are connected to $V_{dd}$. Likewise, P-channel FET device Q2 is a four-terminal device having its gate or control terminal connected to the output of the operational amplifier and its substrate and source electrodes are connected to $V_{dd}$. The drain electrodes of P-channel devices Q1 and Q2 are connected to node B. The source and substrate terminal of P-channel FET device Q3 are connected to node B. The control terminal and drain electrode of P-channel FET device Q3 are tied to ground potential. Signals into the precision gain amplifier are applied at nodes 16 and 18 and signal out of the amplifier is extracted at node Vout.

Mathematical models will now be used to demonstrate the geometric characteristics of the P-channel FET devices. For biasing consideration, FETs Q4 and Q5 form a voltage divider network providing a bias voltage at node A, the inverting input to the operational amplifier. Since the source of each P-channel FET device is tied to its own N-well via its substrate terminal the source to N-well voltage is 0 for both Q4 and Q5. If Q4 and Q5 are identical, the voltage at node A will be $V_{dd}/2$ over the process parameter variations because process changes affecting Q4 will have the same effect on Q5. In the absence of an input signal, terminals 16 and 18 are biased to $V_{dd}/2$ (i.e., a.c. ground). If the sum of the width to length ratio of Q1 and Q2 are chosen to be equal to that of Q3, then $$(W/L)_{Q1} + (W/L)_{Q2} = (W/L)_{Q3} \tag{1}$$

where W and L represent the width and length of respective transistors Q1, Q2 and Q3. Furthermore, if the length of all three FETs Q1, Q2 and Q3 are equal, then the combined effect of Q1, Q2 and Q3 is to form a voltage divider similar to that formed by devices Q4 and Q5. The stable or quiescent operating point is with Vout=Vin=$V_{dd}/2$ (i.e., a.c. ground). When Vout is at any other level, node B would not be at $V_{dd}/2$ and the operational amplifier action is such that Vout will be driven to the point where $V_B$ is nearly equal to $V_A$ (that is, $V_1 - V_B$ is approximately 0). This can only be accomplished when Vout is equal to Vin.

The above analysis is applicable when node A is biased to $V_{dd}/2$. However, as stated above, node A may be biased to any desired voltage between $V_{dd}$ and ground. When node A is biased to values other than $V_{dd}/2$, then the width to length ratio of the P-channel FET devices must satisfy the expression:

$$[(W/L)_{Q1} + (W/L)_{Q2}]/(W/L)_{Q3} = (W/L)_{Q4}/(W/L)_{Q5} \tag{2}$$

Referring to FIG. 1, the current equations for the voltage divider network 12 (Q4 and Q5) are:

$$I_{SD4} = \left(\frac{\mu_s K_{ox} E_o}{2 t_{ox}}\right) \left(\frac{W}{L}\right)_{Q4} (V_{DD} - V_A - V_T)^2 \tag{3}$$

$$I_{SD5} = \left(\frac{\mu_s K_{ox} E_o}{2 t_{ox}}\right) \left(\frac{W}{L}\right)_{Q5} (V_A - V_T)^2 \tag{4}$$

where
 $\mu_s$=surface mobility
 $K_{ox}$=relative dielectric constant of gate oxide
 $E_o$=permittivity in free space
 $t_{ox}$=gate oxide thickness
 W=channel width
 L=channel length
 $V_T$=threshold voltage Setting $I_{SD4} = I_{SD5}$ and solving for the ratio $(W/L)_{Q4}/(W/L)_{Q5}$ gives $$\frac{(W/L)_{Q4}}{(W/L)_{Q5}} = \frac{(V_A - V_T)^2}{(V_{DD} - V_A - V_T)^2} \tag{5}$$

Note that for $V_1 = V_{DD}/2$ the ratio become unity.

As discussed above, the desired quiescent bias point is for $V_{in}(d.c.) = V_{out}(d.c.) = V_A$ and the feedback action is such that $V_B$ will be forced to $V_A$. Under these conditions the combined currents of Q1 and Q2 become:

$$I_{SD1+SD2} = \left(\frac{\mu s K_{ox} E_o}{2 t_{ox}}\right)\left[\left(\frac{W}{L}\right)_{Q1} + \left(\frac{W}{L}\right)_{Q2}\right](V_{DD} - V_A - V_T)^2 \tag{6}$$

$$I_{SD3} = \left(\frac{\mu s K_{ox} E_o}{2 t_{ox}}\right)\left(\frac{W}{L}\right)_{Q3}(V_A - V_T)^2 \tag{7}$$

Setting $I_{SD2} = I_{sd3}$ and solving for the ratio $[(W/L)_{Q1} + (W/L)_{Q2}]/(W/L)_{Q3}$ gives $$\frac{(W/L)_{Q1} + (W/L)_{Q2}}{(W/L)_{Q3}} = \frac{(V_A - V_T)^2}{(V_{DD} - V_A - V_T)^2}$$

From (5) and (8) we see that the relationship given in (2) holds. Thus (2) becomes the biasing design equation.

Figure 3:
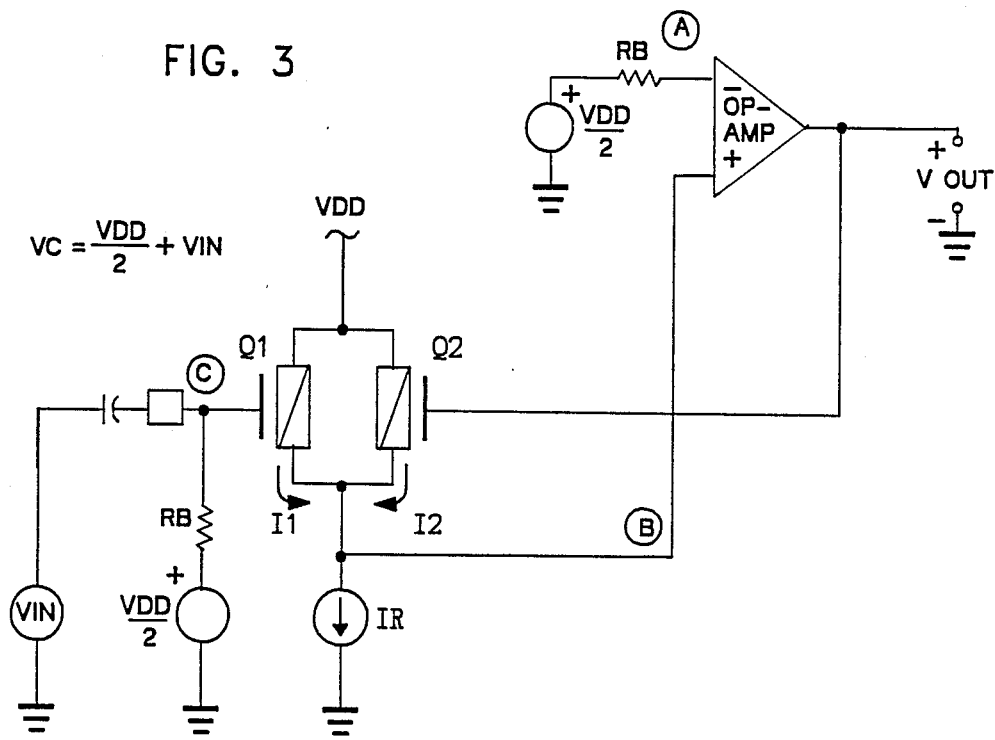
FIG. 3 shows an equivalent circuit diagram for the precision gain amplifier of FIG. 1. The circuit is helpful in understanding the design parameters for the gain setting FET devices.

FIG. 3 shows an equivalent circuit for the precision gain amplifier circuit of FIG. 1. The equivalent circuit is helpful in understanding the design parameters for the gain setting P-channel FET devices Q1 and Q2.

The small-signal equivalent circuit of FIG. 1 is given in FIG. 3. The linear circuit operation of the circuit is such that $V_B = V_A = V_{dd}/2$ and Q3 (FIG. 1) acts as a constant current source $I_R$. The current expressions for Q1 and Q2 become:

$$I_1 = (\mu s K_{ox} E_o)/2 T_{ox} \\ (W/L)_1(V_{SG1} - V_T)^2 (1 + \lambda V_{SD1}) \tag{9}$$

$$I_2 = (\mu s K_{ox} E_o)/2 T_{ox} \\ (W/L)_2(V_{SG2} - V_T)^2 (1 + \lambda V_{SD2}) \tag{10}$$

$$V_{SG1} = V_{DD} - V_C = V_{DD} - (V_{DD}/2 + V_{in}) = V_{DD}/2 - V_{in} \tag{11}$$

$$V_{SG2} = V_{DD} - V_{out} \tag{12}$$

Note from FIG. 1 or FIG. 3 that $V_{SD1} = V_{SD2}$, a constant. By setting $$I_R = I_1 + I_2 \tag{13}$$

and taking the partial derivative of each component with respect to $V_{in}$, equating to zero, and solving for the change in $V_{out}$ with respect to $V_{in}$ $$G = \left[\frac{\partial V_{out}}{\partial V_{in}}\right] = \left[\frac{(W/L)_1}{(W/L)_2}\right]\left[\frac{(V_{DD} - V_C - V_T)}{(V_{DD} - V_{out} - V_T)}\right] \tag{14}$$

For the bias point of $V_C = V_{DD}/2$ and $V_{out} = V_{DD}/2$ the gain becomes $$G \approx \left[\frac{(W/L)_1}{(W/L)_2}\right] \tag{15}$$

a constant dependent only on device geometries.

As the output signal swing becomes large the term $$\left[\frac{V_{DD} - V_C - V_T}{V_{DD} - V_{out} - V_T}\right]$$

no longer equals unity and the gain expression given in (14) must be used.

But for $$|\Delta V_{out}| << V_{DD} - V_{out} - V_T \tag{16}$$

equation (15) is a valid approximation.

Figure 2:
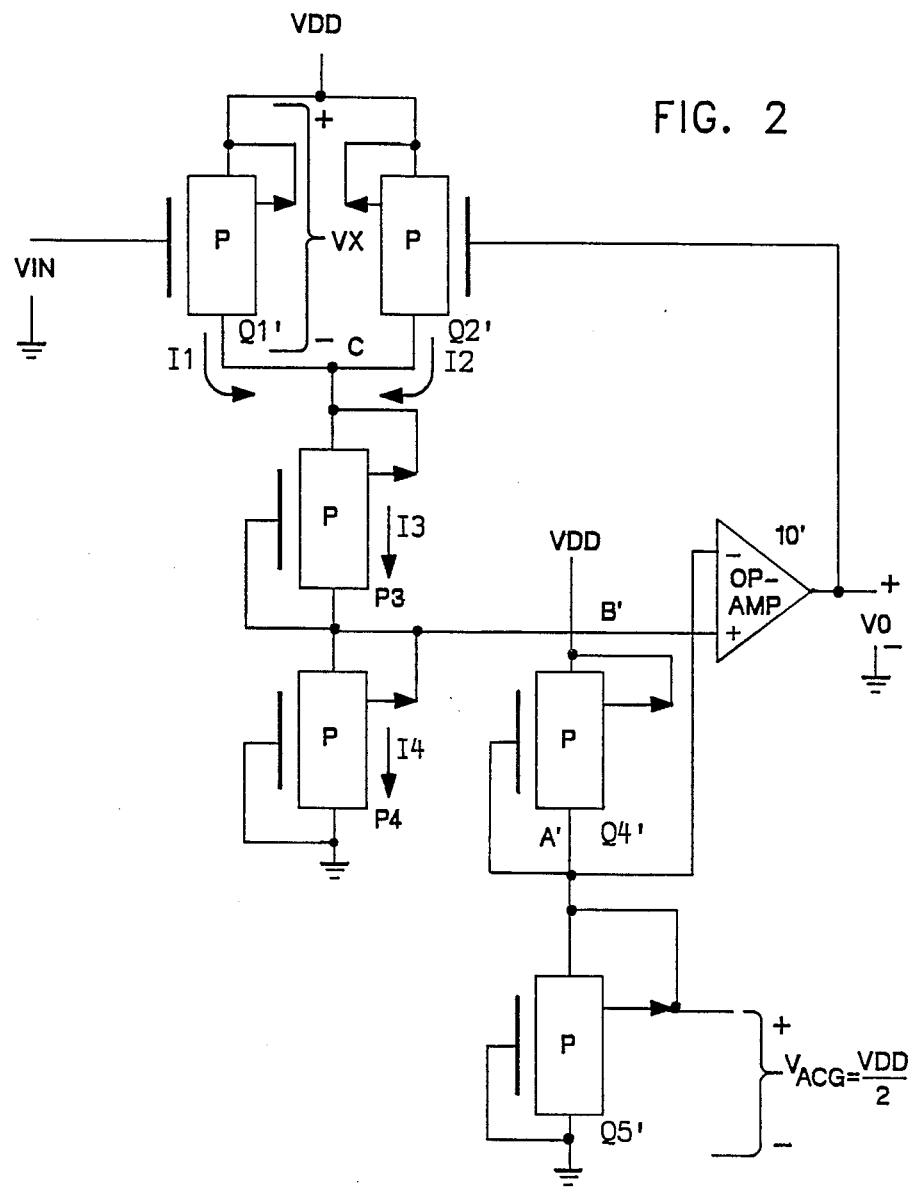
FIG. 2 shows an alternate embodiment of the present invention.

FIG. 2 shows an alternate embodiment for a precision gain amplifier. The precision amplifier of FIG. 2 is similar in several respects to the precision gain amplifier of FIG. 1. However, the precision gain amplifier of FIG. 2 extends the voltage range of signals that can be precisely amplified. This range extension is made possible by discovering a way of achieving the proper bias control of the composite network while operating the gain setting pair of FETs (Q1' and Q2') in their linear region. By comparing FIG. 1 and FIG. 2, one can see that the only difference between these two circuits is that a P-channel FET device P3 has been inserted between the common drains of P-channel FET device Q1' and Q2' and the common node (B') shared by the non-inverting input of operational amplifier 10' and the source of the FET P4 whose gate and drain terminals are grounded. As will be shown by subsequent mathematical analysis, the insertion of P3 allows Q1' and Q2' to be operated in their linear region. By so doing, the voltage range of the incoming signal can be greatly extended.

Mathematical models will now be given to determine the design characteristics of the P-channel FET devices.

During normal circuit operation the feedback connection of the operational amplifier will maintain node B at $V_{ACG}$, which establishes the current $I_4$ at $$I_4 = 0.5K (W/L)_4 (0.5 V_D - V_T)^2 \tag{17}$$

where $K = ((\mu s K_{ox} E_o)/t_{ox})$

The current in P3 is given by $$I_3 = 0.5K(W/L)_3(0.5V_{DD} - V_X - V_T)^2 \tag{18}$$

Note that since $I_3$ is equal to $I_4$, we can consider this fixed and thus by adjusting the W/L ratio of P3 we can set the value of $V_X$. For reasons that will be apparent when the small signal analysis is presented, it is desirable for Q1' and Q2' to be operated in their linear region; i.e., $V_{SD} < (V_{SG} - V_T)$. From FIG. 2 we can see that this requires the following inequalities to hold:

$$V_X < (V_{DD} - V_{IN} - V_T) \tag{19a}$$

and $$V_X < (V_{DD}V_O - V_T). \tag{19b}$$

Knowing the maximum input and output voltge levels a maximum $V_X$ value can be established and then by using (18) the W/L ratio of P3 can be set.

Since Q1' and Q2' are operating in their linear region, the equations for their current becomes $$I_1 = K(W/L)_1(V_{DD} - V_{IN} - V_T - 0.5V_X)V_X \tag{20}$$

and $$I_2 = K(W/L)_2(V_{DD} - V_O - V_T - 0.5V_X)V_X. \quad (21)$$

By summing currents at node C we get $$I_1 + I_2 = I_3, \quad (22)$$

a constant.

By taking the partial derivative with respect to the input voltage we get $$(\partial I_1/\partial V_{IN}) + (\partial I_2/\partial V_{IN}) = 0. \quad (23)$$

From (20) and (21) we get $$(+K(W/L) + (K(W/L)_2(\partial V_{OUT}/\partial V_{IN})) = 0. \quad (24)$$

Solving for the gain, $A_V$, gives $$A_{VV} = \partial V_{OUT}/\partial V_{IN} = -[(W/L)_1/(W/L)_2] = -G \quad (25)$$

where $$G = [(W/L)_1/(W/L)_2] \quad (26)$$

Note that (25) is valid as long as Q1 and Q2 are operating in their linear region.

This allows much larger signals to be processed than for the circuit of FIG. 1 where (16) sets an upper bound.

We claim:

1. An improved amplifier circuit arrangement for integrating with other components on a semiconductor chip said amplifier circuit arrangement comprising:
    a power supply having a single voltage supply rail;
    an amplifier circuit means having an inverting input terminal, a non-inverting input terminal and an output terminal;
    a voltage divider network for generating a reference biasing voltage coupled to the inverting input;
    a gain setting network including only active circuit devices for setting the gain of said amplifier; said gain setting network having a first node coupled to the single voltage supply rail, a second node coupled to the non-inverting input terminal, a first control terminal coupled to an input signal source and a second control terminal coupled to the output terminal; and
    a first FET device having a source and a substrate terminal coupled to the second node and a control terminal and drain terminal coupled to a reference potential.

2. The amplifier circuit arrangement of claim 1 further including a second FET device having a source and a substrate terminal coupled to the gain setting network and a control terminal and a drain terminal connected to the second node.

3. The amplifier circuit arrangement of claims 1 or 2 wherein the FET devices are P-channel enhancement type devices.

4. The improved amplifier circuit arrangement of claim 1 wherein the amplifier circuit means includes an operational amplifier.

5. The amplifier circuit of claim 1 wherein the voltage divider network includes a second P-channel enhancement type FET device connected in series with a third P-channel FET device.

6. The amplifier circuit arrangement of claim 1 wherein the gain setting network includes a first P-channel FET device; and
    a second P-channel FET device connected in parallel with the first P-channel FET device and a third P-channel FET device connected in series with the first and second FET devices.

7. An improved CMOS amplifier circuit arrangement comprising:
    an operational amplifier having a negative input terminal, a positive input terminal and an output terminal;
    a fourth P-channel enhancement type FET device having a control terminal and a drain terminal connected to the negative input terminal and a substrate terminal and source terminal connected to a positive voltage potential;
    a fifth P-channel enhancement type FET device connected in series with the fourth FET device; said fifth P-channel enhancement FET device having a source terminal and a substrate terminal connected to the negative input terminal and a drain and control terminals connected to a ground voltage potential;
    a first P-channel enhancement type FET device having a source and substrate terminal connected to the positive voltage potential, a control terminal connected to a signal source and a drain terminal connected to the positive input terminal;
    a second P-channel enhancement type FET device having a control terminal connected to the output terminal, a source and substrate terminal connected to the positive voltage potential and a drain terminal connected to the positive input terminal; and
    a third P-channel enhancement type FET device having a substrate and source electrodes connected to the positive input terminal and a control and a drain electrode connected to the ground voltage potential.

8. An improved amplifier circuit arrangement for integrated with other devices on a chip using a CMOS fabricating process, said amplifier circuit arrangement comprising:
    an operational amplifier having a negative voltage input terminal, a positive voltage input terminal and an output terminal;
    a first biasing circuit network for generating and applying a reference voltage to the negative voltage input terminal; said biasing circuit network having a fourth and fifth P-channel FET devices connected in series; and
    a feedback means interconnecting the output terminal to the positive voltage input, said feedback means including a second biasing network for setting the gain of the amplifier circuit and including a first P-channel FET device connected in parallel to a second P-channel FET device and a third P-channel FET device connected in series to the first and second P-channel devices.

9. The improved amplifier circuit arrangement of claim 8 wherein the (W/L) ratios of the P-channel FETs are $$\left[ \frac{(W/L)_{Q1} + (W/L)_{Q2}}{(W/L)_{Q3}} = \frac{(W/L)_{Q4}}{(W/L)_{Q5}} \right]$$

where
W represents the device width,
L represents the device length,
$Q_1$ represents the first P-channel device,
$Q_2$ represents the second P-channel device,
$Q_3$ represents the third P-channel device,
$Q_4$ represents the fourth P-channel device, and
$Q_5$ represents the fifth P-channel device.

10. In an integrated circuit chip having digital and analog circuits thereon and at least an operational amplifier having a negative input terminal, a positive input terminal and an output terminal, a circuit arrangement for biasing said operational amplifier comprising:
   a first biasing circuit network for generating and applying a reference voltge to the negative input terminal; said biasing circuit network having a fourth and fifth P-channel FET devices connected in series; and
   a feedback means interconnecting the output terminal to the positive voltage input, said feedback means including a second biasing network for setting the gain of the amplifier circuit and including a first P-channel FET device connected in parallel to a second P-channel FET device and a third P-channel FET device connected in series to the first and second P-channel devices.

11. The circuit arrangement of claim 10 wherein (W/L) ratios of the P-channel FET devices satisfiy the expression:
$(W/L)_{Q4} = (W/L)_{Q5}$ and
$(W/L)_{Q3} = (W/L)_{Q1} + (W/L)_{Q2}$
where W represents device width,
where L represents device length,
where $Q_1$ represents the first P-channel device,
where $Q_2$ represents the second P-channel device,
where $Q_3$ represents the third P-channel device,
where $Q_4$ represents the fourth P-channel device, and
where $Q_5$ represents the fifth P-channel device.

12. An improved CMOS amplifier circuit arrangement comprising:
   an operational amplifier having a negative input terminal, a positive input terminal and an output terminal;
   a fourth P-channel enhancement type FET device having a control terminal and a drain terminal connected to the negative input terminal and a substrate terminal and source terminal connected to a first node;
   a fifth P-channel enhancement type FET device connected in series with the fourth FET device; said fifth P-channel enhancement FET device having a source terminal and a substrate terminal connected to the negative input terminal and a drain and control terminals connected to a second node;
   a first P-channel enhancement type FET device having a source and substrate terminal connected to the first node, a control terminal connected to a signal source and a drain terminal coupled to the positive input terminal;
   a second P-channel enhancement type FET device having a control terminal connected to the output terminal, a source and substrate terminal connected to the first node, and a drain terminal connected to the positive input terminal; and
   a third P-channel enhancement type FET device having a substrate and source electrodes connected to the positive input terminal and a control and a drain electrode connected to a ground voltage potential.

13. The CMOS amplifier circuit arrangement of claim 12 further including a power supply with a positive voltage potential connected to the first node and a ground potential connected to the second node.

14. An improved CMOS amplifier circuit for integrating with other circuit components on a semiconductor chip said amplifier circuit comprising:
   an operational amplifier having a negative input terminal, a positive input terminal and an output terminal;
   a fourth FET device having a control terminal and a drain terminal coupled to the negative input terminal and a substrate terminal and source terminal coupled to a first node;
   a fifth FET device coupled in series with the fourth FET device; said fifth FET device having a source terminal and a substrate terminal coupled to the negative input and a drain and a control terminal coupled to a second node;
   a first FET device having a source and a substrate terminal coupled to the first node, a control terminal coupled to a signal source and a drain terminal coupled to a third node;
   a second FET device having a control terminal coupled to the output terminal, a source and a substrate terminal coupled to the first node and a drain terminal coupled to the third node; and
   a third FET device having a substrate and a source electrode coupled to the third node and a control and a drain electrode connected to the positive input terminal.

15. The amplifier circuit of claim 14 further including a fourth FET device having a substrate and a source electrode coupled to the positive input terminal and a control and drain electrode coupled to the second node.

* * * * *